United States Patent
Yanagisawa et al.

(10) Patent No.: US 8,850,887 B2
(45) Date of Patent: Oct. 7, 2014

(54) DETECTION CIRCUIT, PHYSICAL QUANTITY DETECTION APPARATUS, ANGULAR VELOCITY DETECTION APPARATUS, INTEGRATED CIRCUIT DEVICE, AND ELECTRONIC INSTRUMENT

(75) Inventors: Yoshinao Yanagisawa, Ueda (JP); Masahiro Oshio, Shiojiri (JP); Takayuki Kikuchi, Okaya (JP); Toshihiro Nishida, Nasushiobara (JP); Masayuki Takahashi, Nasushiobara (JP)

(73) Assignees: Seiko Epson Corporation (JP); Seiko NPC Corporation (JP)

( * ) Notice: Subject to any disclaimer, the term of this patent is extended or adjusted under 35 U.S.C. 154(b) by 253 days.

(21) Appl. No.: 13/404,475

(22) Filed: Feb. 24, 2012

(65) Prior Publication Data

US 2013/0055810 A1 Mar. 7, 2013

(30) Foreign Application Priority Data

Feb. 25, 2011 (JP) ................... 2011-040135

(51) Int. Cl.
*G01C 19/56* (2012.01)
*H03H 9/24* (2006.01)
*G01C 19/5776* (2012.01)

(52) U.S. Cl.
CPC ............. *G01C 19/56* (2013.01); *H03H 9/2468* (2013.01); *G01C 19/5776* (2013.01)
USPC ..................................................... 73/504.12

(58) Field of Classification Search
CPC ............... G01C 19/56; G01C 19/5776; G01C 19/5712; G01C 19/5747; G01C 19/5719

USPC ........................................................ 73/504.12
See application file for complete search history.

(56) References Cited

U.S. PATENT DOCUMENTS

| | | | |
|---|---|---|---|
| 5,774,555 | A | 6/1998 | Lee et al. |
| 5,794,080 | A | 8/1998 | Watanabe et al. |
| 6,028,332 | A | 2/2000 | Kano et al. |
| 6,288,474 | B1 | 9/2001 | Ono et al. |
| 6,345,533 | B1 | 2/2002 | Nozoe |
| 6,497,146 | B1 | 12/2002 | Hobbs et al. |
| 7,124,632 | B2 | 10/2006 | Smith |
| 7,197,930 | B2 | 4/2007 | Sugiki et al. |
| 7,441,458 | B2 | 10/2008 | Yokoi et al. |
| 7,782,042 | B2 * | 8/2010 | Fukuzawa ................ 323/314 |
| 7,812,681 | B2 | 10/2010 | Kanai et al. |

(Continued)

FOREIGN PATENT DOCUMENTS

| | | |
|---|---|---|
| CN | 101184973 A | 5/2008 |
| CN | 101520327 A | 9/2009 |
| JP | 07-270165 | 10/1995 |
| JP | 11-026777 | 1/1999 |

(Continued)

*Primary Examiner* — Hezron E Williams
*Assistant Examiner* — Gregory J Redmann
(74) *Attorney, Agent, or Firm* — Harness, Dickey & Pierce, P.L.C.

(57) ABSTRACT

A detection circuit includes a synchronous detection circuit (synchronous detection section) that synchronously detects a signal that includes a detection signal of a vibrator (an output signal of an amplifier), a switched capacitor filter (SCF) circuit that filters a signal that has been synchronously detected by the synchronous detection circuit (an output signal of a programmable gain amplifier), and an output buffer that buffers and outputs a signal that has been filtered by the SCF circuit, the gain of the SCF circuit being larger than 1.

5 Claims, 9 Drawing Sheets

(56) References Cited

U.S. PATENT DOCUMENTS

| | | |
|---|---|---|
| 7,845,227 B2 | 12/2010 | Fukuzawa |
| 7,849,744 B2 | 12/2010 | Kanai et al. |
| 7,849,746 B2 | 12/2010 | Kanai et al. |
| 7,896,894 B2 | 3/2011 | Ortiz et al. |
| 8,026,771 B2 | 9/2011 | Kanai et al. |
| 2009/0217757 A1 | 9/2009 | Nozawa |
| 2010/0011856 A1 | 1/2010 | Nagata |
| 2010/0326189 A1 | 12/2010 | Sato et al. |

FOREIGN PATENT DOCUMENTS

| | | |
|---|---|---|
| JP | 2000-002543 | 1/2000 |
| JP | 2002-174521 | 6/2002 |
| JP | 2006-162276 | 6/2006 |
| JP | 2008-014932 | 1/2008 |
| JP | 2008-014932 A | 1/2008 |
| JP | 2008-064663 | 3/2008 |
| JP | 2010-286368 A | 12/2010 |
| WO | 2005-068938 | 7/2005 |

* cited by examiner

DETECTION CIRCUIT, PHYSICAL QUANTITY DETECTION APPARATUS, ANGULAR VELOCITY DETECTION APPARATUS, INTEGRATED CIRCUIT DEVICE, AND ELECTRONIC INSTRUMENT

Japanese Patent Application No. 2011-40135, filed on Feb. 25, 2011, is hereby incorporated by reference in its entirety.

BACKGROUND OF THE INVENTION

The present invention relates to a detection circuit, a physical quantity detection apparatus, an angular velocity detection apparatus, an integrated circuit device, and an electronic instrument.

A gyro sensor is provided in various electronic instruments such as a digital camera, a navigation system, and a mobile phone. An image stabilization process, a dead reckoning process, a motion sensing process, or the like is performed based on the magnitude of the angular velocity detected by the gyro sensor.

In recent years, a reduction in size and an increase in detection accuracy has been desired for a gyro sensor. For example, a vibrating gyro sensor that utilizes the resonance phenomenon of a crystal vibrator has been widely used as a gyro sensor that meets such a demand. Since the detection signal output from the vibrator becomes small along with a reduction in size of such a vibrating gyro sensor, it is very important to reduce noise generated by a signal processing circuit that performs a drive process and a detection process in order to implement high detection accuracy.

The detection process performed by the signal processing circuit includes amplifying and synchronously detecting a small detection signal output from the vibrator, and removing a harmonic component and high-frequency noise using a low-pass filter. The resulting detection signal is output to the outside via an output buffer. The output buffer adjusts the level of the detection signal according to the desired detection sensitivity. A switched capacitor filter (SCF) for which the frequency characteristics are determined by the capacitance ratio and the sampling frequency (clock frequency) is used as the low-pass filter. The switched capacitor filter has an advantage in that a variation in characteristics is small as compared with an RC filter (see JP-A-2008-14932 and JP-A-2008-64663).

Since noise that occurs in the low-pass filter is significantly small as compared with noise that occurs in the preceding stage of the low-pass filter, measures for reducing noise that occurs in the preceding stage of the low-pass filter have been mainly employed. However, since noise that occurs in the low-pass filter relatively increases due to a decrease in noise that occurs in the preceding stage of the low-pass filter, the S/N ratio of the output signal may deteriorate. It is difficult to reduce noise that occurs in the low-pass filter without significantly increasing the circuit area. Therefore, it may be impossible to meet a demand for a reduction in size when it is desired to further reduce noise. The amplification factor of noise that occurs in the low-pass filter may be decreased by decreasing the gain of the output buffer by increasing the gain in the preceding stage of the low-pass filter. However, it may be impossible to increase the gain in the preceding stage of the low-pass filter depending on the design.

SUMMARY

The invention may provide a detection circuit, a physical quantity detection apparatus, an angular velocity detection apparatus, an integrated circuit device, and an electronic instrument that can implement a reduction in noise.

According to a first aspect of the invention, there is provided a detection circuit including:

a synchronous detection section that synchronously detects an alternating-current signal that corresponds to a detection target physical quantity;

a switched capacitor filter that filters a signal that has been synchronously detected by the synchronous detection section; and an output buffer that buffers and outputs a signal that has been filtered by the switched capacitor filter, a gain of the switched capacitor filter being larger than 1.

According to a second aspect of the invention, there is provided a physical quantity detection apparatus including:

the detection circuit; and a vibrator that outputs a signal that corresponds to a detection target physical quantity to the detection circuit.

According to a third aspect of the invention, there is provided an angular velocity detection apparatus including the detection circuit.

According to a fourth aspect of the invention, there is provided an integrated circuit device including the detection circuit.

According to a fifth aspect of the invention, there is provided an electronic instrument including the detection circuit.

DETAILED DESCRIPTION OF THE EMBODIMENT (1) One embodiment of the invention relates to a detection circuit including:

a synchronous detection section that synchronously detects an alternating-current signal that corresponds to a detection target physical quantity;

a switched capacitor filter that filters a signal that has been synchronously detected by the synchronous detection section; and an output buffer that buffers and outputs a signal that has been filtered by the switched capacitor filter, a gain of the switched capacitor filter being larger than 1.

According to the detection circuit, the gain of the output buffer can be relatively decreased by causing the switched capacitor filter that functions as a filter to also function as an amplifier circuit by setting the gain of the switched capacitor filter to a value larger than 1. This makes it possible to decrease the amplification factor of the output buffer on noise that occurs in the switched capacitor filter, so that noise can be reduced.

(2) In the detection circuit, $K_1/K_2 > 0.5$ may be satisfied when the gain of the switched capacitor filter is referred to as $K_1$, and a gain of the output buffer is referred to as $K_2$.

(3) In the detection circuit, a gain $K_1$ of the switched capacitor filter may be larger than a gain $K_2$ of the output buffer.

(4) Another embodiment of the invention relates to a physical quantity detection apparatus including:

the detection circuit; and a vibrator that outputs a signal that corresponds to a detection target physical quantity to the detection circuit.

It is thus possible to provide a physical quantity detection apparatus that can implement a reduction in noise.

(5) Another embodiment of the invention relates to an angular velocity detection apparatus including the detection circuit.

It is thus possible to provide an angular velocity detection apparatus that can implement a reduction in noise.

(6) Another embodiment of the invention relates to an integrated circuit device including the detection circuit.

(7) A further embodiment of the invention relates to an electronic instrument including the detection circuit.

Exemplary embodiments of the invention are described in detail below with reference to the drawings. Note that the following exemplary embodiments do not unduly limit the scope of the invention as stated in the claims. Note also that all of the elements described below should not necessarily be taken as essential elements of the invention.

1. Physical Quantity Detection Apparatus

An example in which the invention is applied to a physical quantity detection apparatus (angular velocity detection apparatus) that detects an angular velocity (i.e., physical quantity) is described below. Note that the invention may be applied to an apparatus that detects an arbitrary physical quantity (e.g., angular velocity, angular acceleration, acceleration, or force).

Figure 1:
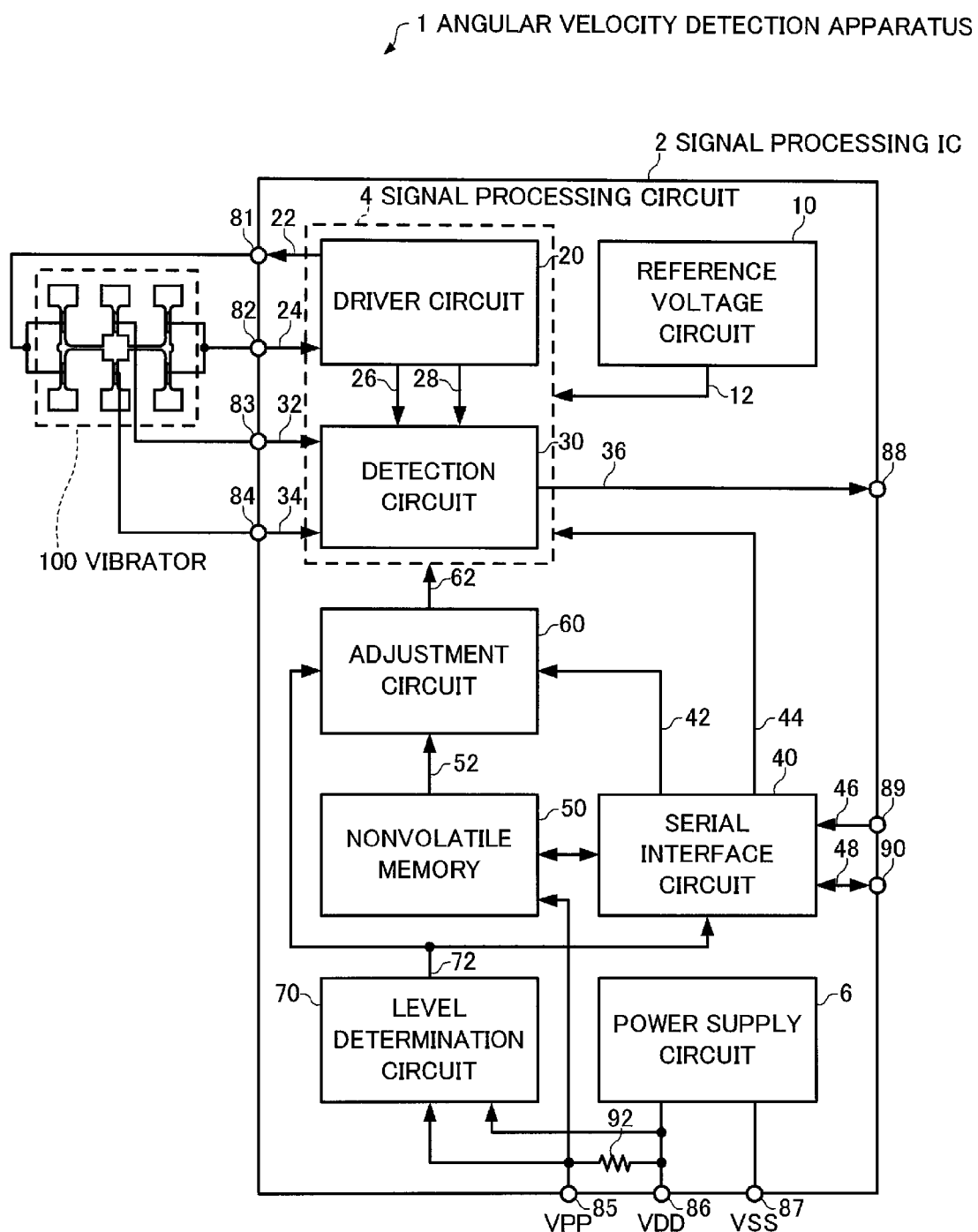
FIG. 1 is a functional block diagram of an angular velocity detection apparatus (an example of a physical quantity detection apparatus) according to one embodiment of the invention.

FIG. 1 is a functional block diagram of an angular velocity detection apparatus (an example of a physical quantity detection apparatus) according to one embodiment of the invention. An angular velocity detection apparatus 1 illustrated in FIG. 1 includes a vibrator (sensor element) 100 and a signal processing IC (integrated circuit device) 2.

The vibrator 100 includes a vibrating element that includes a drive electrode and a detection electrode, the vibrating element being sealed in a package that is not illustrated in FIG. 1. The package normally has seal-tightness in order to reduce the impedance of the vibrating element and improve the vibration efficiency as much as possible.

The vibrator 100 includes the vibrating element that is formed using a Z-cut quartz crystal substrate. A vibrating element formed using a quartz crystal has an advantage in that the angular velocity detection accuracy can be improved since the resonance frequency changes to only a small extent due to a change in temperature. Note that the vibrating element included in the vibrator 100 may be formed using a piezoelectric material (e.g., piezoelectric single crystal (e.g., lithium tantalate ($LiTaO_3$) or lithium niobate ($LiNbO_3$)) or piezoelectric ceramic (e.g., lead zirconate titanate (PZT))) or semiconductor silicon instead of a quartz crystal ($SiO_2$). For example, the vibrating element may have a structure in which a piezoelectric thin film (e.g., zinc oxide (ZnO) or aluminum nitride (AlN)) is disposed between the drive electrodes on the surface of semiconductor silicon.

The vibrator 100 is formed using a double-T-shaped vibrating element that includes two T-shaped vibrating drive arms. Note that the vibrating element may have a tuning-fork structure, a comb-like structure, or a tuning-bar structure in the shape of a triangular prism, a quadrangular prism, or a column, for example.

Figure 2:
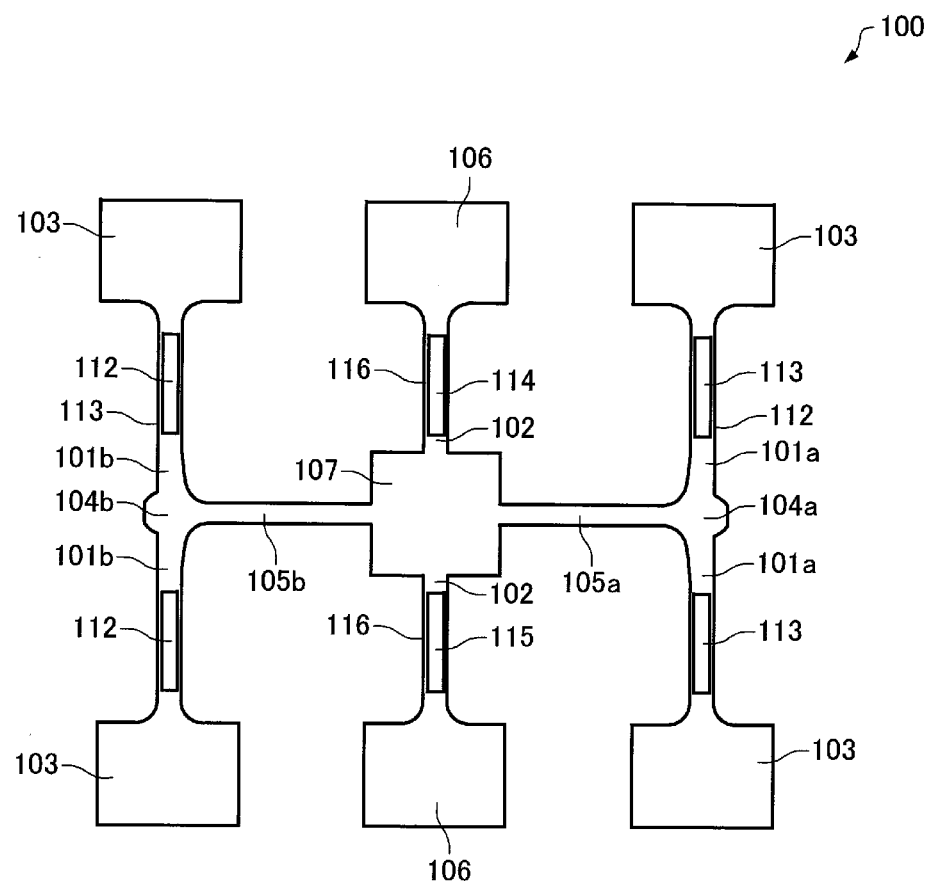
FIG. 2 is a plan view illustrating a vibrating element of a vibrator.

FIG. 2 is a plan view illustrating the vibrating element included in the vibrator 100. The X-axis, the Y-axis, and the Z-axis illustrated in FIG. 2 indicate the axes of the quartz crystal.

As illustrated in FIG. 2, the vibrating element included in the vibrator 100 includes vibrating drive arms 101a and 101b that extend respectively from drive bases 104a and 104b in the +Y-axis direction and the −Y-axis direction. The angle formed by the Y-axis and the extension direction of the vibrating drive arms 101a and 101b is within ±5°. Drive electrodes 112 and 113 are respectively formed on the side surface and the upper surface of the vibrating drive arm 101a, and drive electrodes 113 and 112 are respectively formed on the side surface and the upper surface of the vibrating drive arm 101b. The drive electrodes 112 and 113 are connected to a driver circuit 20 respectively via an external output terminal 81 and an external input terminal 82 of the signal processing IC 2 illustrated in FIG. 1.

The drive bases 104a and 104b are connected to a rectangular detection base 107 via connection arms 105a and 105b that respectively extend in the −X-axis direction and the +X-axis direction. The angle formed by the X-axis and the extension direction of the connection arms 105a and 105b is within ±5°.

Vibrating detection arms 102 extend from the detection base 107 in the +Y-axis direction and the −Y-axis direction. The angle formed by the Y-axis and the extension direction of the vibrating detection arms 102 is within ±5°. Detection electrodes 114 and 115 are formed on the upper surface of the vibrating detection arms 102, and common electrodes 116 are formed on the side surface of the vibrating detection arms 102. The detection electrodes 114 and 115 are connected to a detection circuit 30 respectively via external input terminals 83 and 84 of the signal processing IC 2 illustrated in FIG. 1. The common electrodes 116 are grounded.

Figure 3:
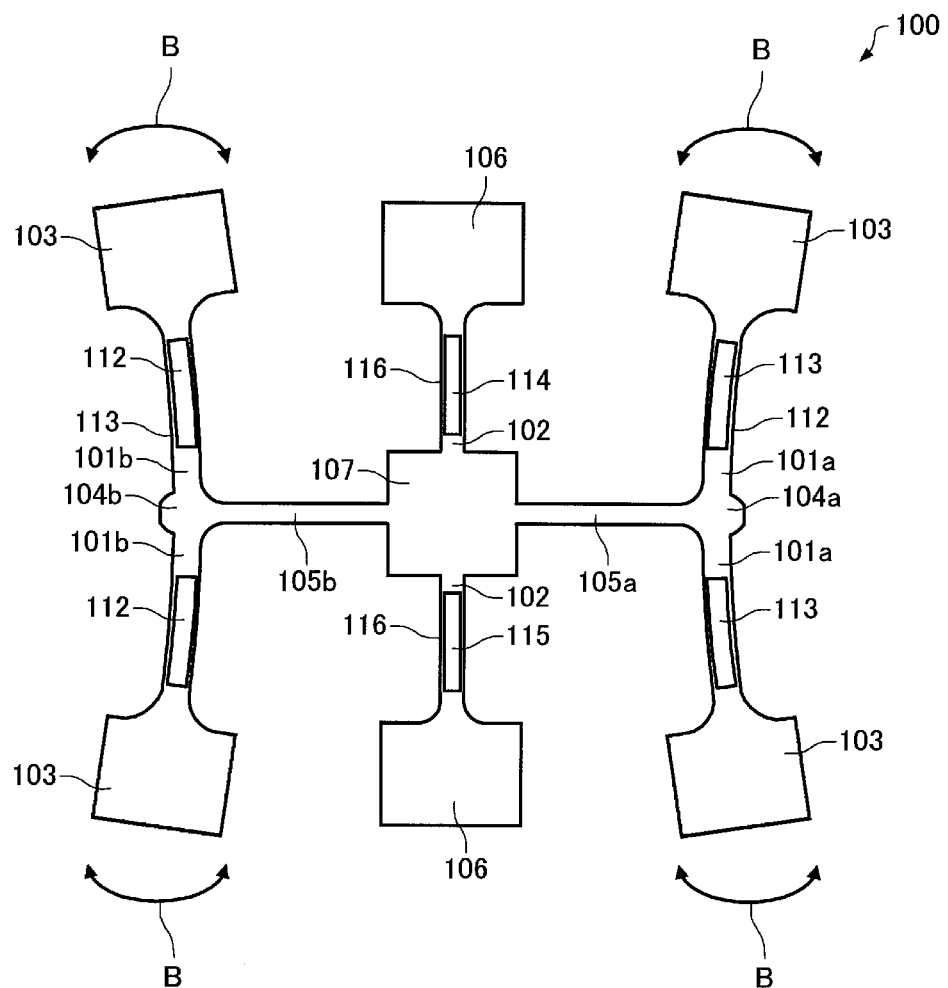
FIG. 3 is a diagram illustrating an operation of a vibrator.

When an alternating voltage (drive signal) is applied between the drive electrodes 112 and 113 of the vibrating drive arms 101a and 101b, the vibrating drive arms 101a and 101b produce flexural vibrations (excited vibrations) so that the ends of the vibrating drive arms 101a and 101b repeatedly move closer and away (see arrow B) due to an inverse piezoelectric effect (see FIG. 3).

Figure 4:
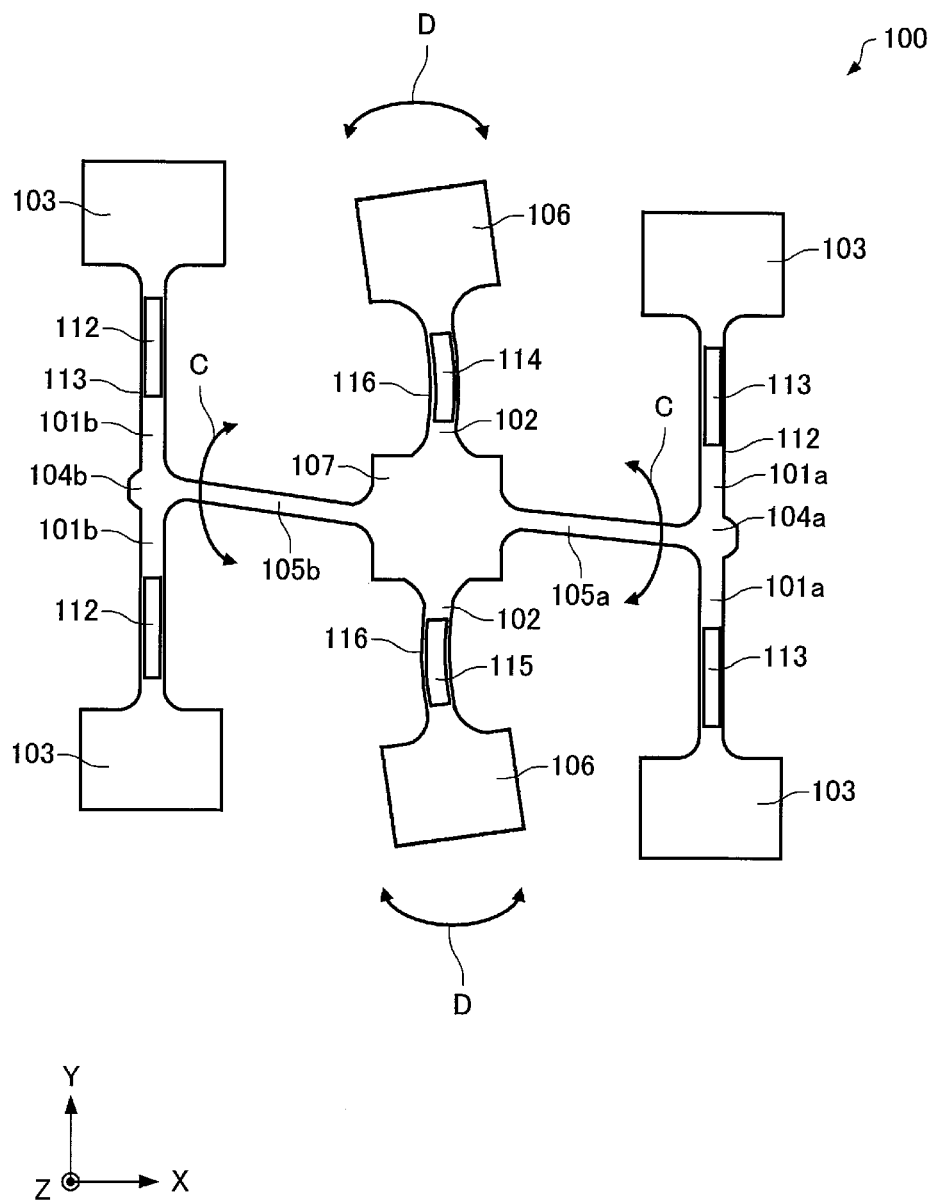
FIG. 4 is a diagram illustrating an operation of a vibrator.

When an angular velocity around the Z-axis is applied to the vibrating element included in the vibrator 100, the vibrating drive arms 101a and 101b are subjected to a Coriolis force in the direction that is perpendicular to the direction of the flexural vibrations (see arrow B) and the Z-axis. Therefore, the connection arms 105a and 105b produce vibrations (see arrow C in FIG. 4). The vibrating detection arms 102 produce flexural vibrations (see arrow D) in synchronization with the vibrations (see arrow C) of the connection arms 105a and 105b. The flexural vibrations of the vibrating detection arms 102 due to the Coriolis force differ in phase from the flexural vibrations (excited vibrations) of the vibrating drive arms 101a and 101b by 90°.

The vibration energy of the vibrating drive arms 101a and 101b is balanced when the magnitude of the vibration energy or the vibration amplitude of each vibrating drive arm is equal when the vibrating drive arms 101a and 101b produce flexural vibrations (excited vibrations), and the vibrating detection arms 102 do not produce flexural vibrations when an angular velocity is not applied to the vibrator 100. When the vibration energy of the vibrating drive arms 101a and 101b has become unbalanced, the vibrating detection arms 102 produce flexural vibrations even when an angular velocity is not applied to the vibrator 100. The above flexural vibrations are referred to as "leakage vibrations". The leakage vibrations are flexural vibrations (see arrow D) in the same manner as the vibrations based on the Coriolis force, but occur in the same phase as the drive signal.

An alternating charge based on the flexural vibrations occurs in the detection electrodes 114 and 115 of the vibrating detection arms 102 due to a piezoelectric effect. An alternating charge that is generated based on the Coriolis force changes depending on the magnitude of the Coriolis force (i.e., the magnitude of the angular velocity applied to the vibrator 100). On the other hand, an alternating charge that is generated based on the leakage vibrations is independent of the magnitude of the angular velocity applied to the vibrator 100.

A rectangular weight section 103 that is wider than the vibrating drive arms 101a and 101b is formed at the end of the vibrating drive arms 101a and 101b. This makes it possible to increase the Coriolis force while obtaining the desired resonance frequency using relatively short vibrating arms. A weight section 106 that is wider than the vibrating detection arms 102 is formed at the end of the vibrating detection arm 102. This makes it possible to increase the amount of alternating charge that flows through the detection electrodes 114 and 115.

The vibrator 100 thus outputs an alternating charge (i.e., angular velocity component) that is generated based on the Coriolis force and an alternating charge (i.e., leakage vibration component) that is generated based on the leakage vibrations of the excited vibrations via the detection electrodes 114 and 115 (detection axis: Z-axis).

Again referring to FIG. 1, the signal processing IC 2 includes a power supply circuit 6, a reference voltage circuit 10, the driver circuit 20, the detection circuit 30, a serial interface circuit 40, a nonvolatile memory 50, an adjustment circuit 60, and a level determination circuit 70. Note that the signal processing IC 2 may have a configuration in which some of these sections (elements) are omitted, or an additional section (element) is provided.

The power supply circuit 6 receives a power supply voltage VDD (e.g., 3 V) and a ground voltage VSS (0 V) respectively via an external input terminal 86 and an external input terminal 87, and generates an internal power supply voltage of the signal processing IC 2.

The reference voltage circuit 10 generates a reference voltage 12 (e.g., ½ VDD) based on the power supply voltage supplied via the power supply circuit 6.

The driver circuit 20 generates a drive signal 22 that causes the vibrator 100 to produce excited vibrations, and supplies the drive signal 22 to the drive electrode 112 of the vibrator 100 via the external output terminal 81. The driver circuit 20 receives an oscillation current 24 generated through the drive electrode 113 due to the excited vibrations of the vibrator 100 via the external input terminal 82, and feedback-controls the amplitude level of the drive signal 22 so that the amplitude of the oscillation current 24 is maintained constant. The driver circuit 20 generates a reference signal 26 that is input to a synchronous detection circuit included in the detection circuit 30, and also generates a clock signal 28 that is input to a switched capacitor filter (SCF) circuit included in the detection circuit 30.

The detection circuit 30 receives an alternating charge (detection current) 32 generated through the detection electrode 114 of the vibrator 100 via the external input terminal 83, and receives an alternating charge (detection current) 34 generated through the detection electrode 115 of the vibrator 100 via the external input terminal 84. The detection circuit 30 detects only the angular velocity component included in the alternating charge (detection current), generates a signal (angular velocity signal) 36 at a voltage level corresponding to the magnitude of the angular velocity, and outputs the angular velocity signal 36 to the outside via an external output terminal 88. The angular velocity signal 36 is A/D-converted by a microcomputer (not illustrated in FIG. 1) or the like that is connected to the external output terminal 88, and is used for various processes as angular velocity data. Note that the signal processing IC 2 may include an A/D converter, and digital data that indicates the angular velocity may be output to the outside via the serial interface circuit 40, for example.

The driver circuit 20 and the detection circuit 30 thus function as a signal processing circuit 4 that performs signal processing on the vibrator 100.

The adjustment circuit 60 selects adjustment data 52 or adjustment data 42 corresponding to a level determination signal 72 output from the level determination circuit 70, and generates an analog adjustment voltage 62 (e.g., offset compensation voltage or temperature compensation voltage) that is input to the signal processing circuit 4 (driver circuit 20 and detection circuit 30). The adjustment circuit 60 is a D/A converter or the like.

The nonvolatile memory 50 stores the adjustment data 52 for the signal processing circuit 4 (driver circuit 20 and detection circuit 30). The nonvolatile memory 50 may be implemented by an electrically erasable programmable read-only memory (EEPROM), for example.

The serial interface circuit 40 writes or reads the adjustment data 52 into or from the nonvolatile memory 50, or writes or reads the adjustment data 42 or mode setting data 44 into or from an internal register (not illustrated in FIG. 1) via a double rail logic using a clock signal 46 and a serial data signal 48 input via an external input terminal 89 and an external input/output terminal 90.

Figure 5:
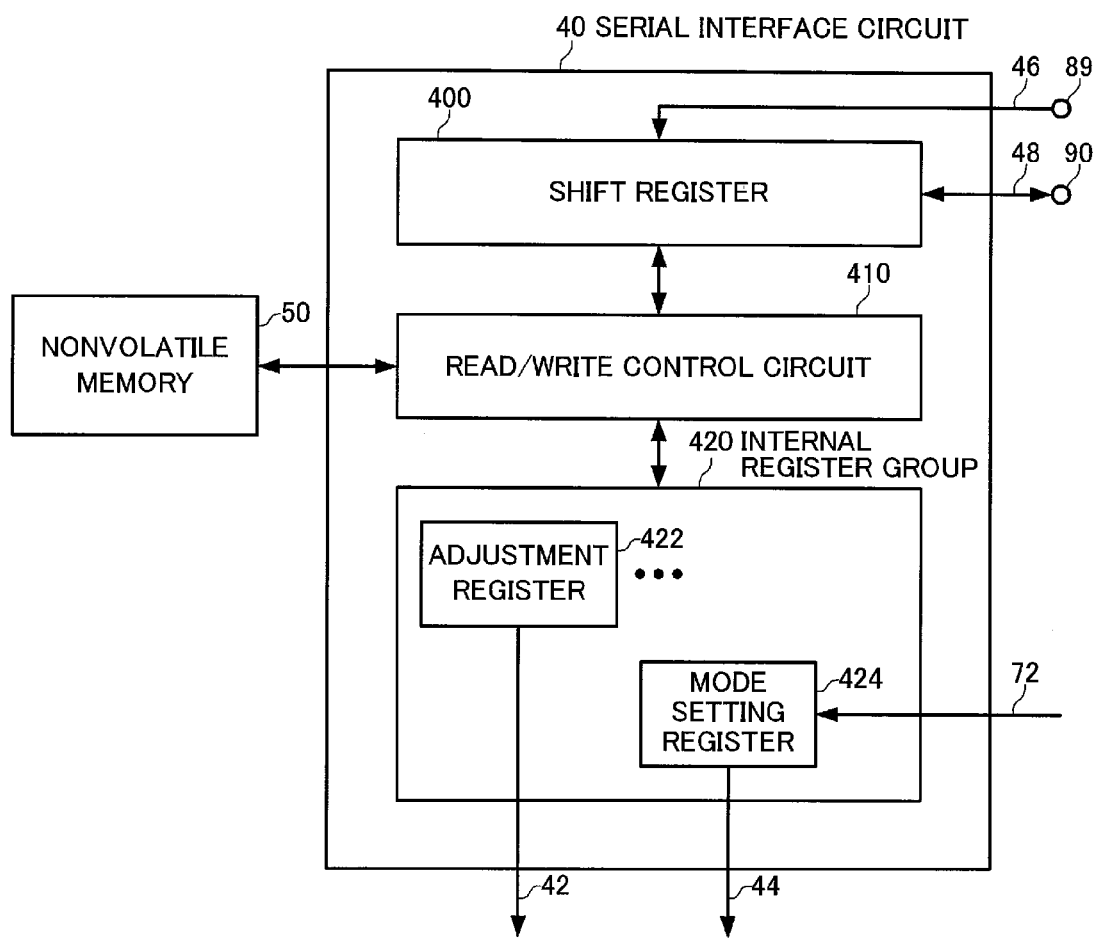
FIG. 5 is a diagram illustrating a configuration example of a serial interface circuit.

FIG. 5 is a diagram illustrating a configuration example of the serial interface circuit 40. When the serial interface circuit 40 writes data, the serial interface circuit 40 inputs the serial data signal 48 input via the external input/output terminal 90 to a shift register 400 in synchronization with the clock signal 46 input via the external input terminal 89 to convert the serial data signal 48 into parallel data, and writes the parallel data into the nonvolatile memory 50 or a register (e.g., adjustment register 422 or mode setting register 424) included in an internal register group 420 under control of a read/write control circuit 410. When the serial interface circuit 40 reads data, the serial interface circuit 40 loads data stored in the nonvolatile memory 50 or data stored in a register included in the internal register group 420 in parallel under control of the read/write control circuit 410, shifts the data using the shift register 400 in synchronization with the clock signal 46 input via the external input terminal 89, and outputs the serial data signal 48 via the external input/output terminal 90.

When writing data into the nonvolatile memory 50, it is necessary to supply energy sufficient to invert the data stored in the memory element. Therefore, a high power supply voltage VPP (e.g., 15 V or more) is supplied to the nonvolatile memory 50 via an external input terminal 85 (see FIG. 1) when writing data into the nonvolatile memory 50.

Data is written into the nonvolatile memory 50 only during assembly, inspection, evaluation, analysis, or the like of the angular velocity detection apparatus 1, and writing of data into the nonvolatile memory 50 is prohibited when the angular velocity detection apparatus 1 is actually used. Therefore, the external input terminal 85 is set to open when the angular velocity detection apparatus 1 is actually used. Accordingly, the voltage VPP at the external input terminal 85 becomes almost equal to the voltage VDD via a pull-up resistor 92, so that a situation in which data is erroneously written into the nonvolatile memory 50 can be prevented.

The adjustment data 52 is written into the nonvolatile memory 50 during final inspection of the angular velocity detection apparatus 1, for example. Specifically, an adjustment value is written into the adjustment register 422 of the internal register group included in the serial interface circuit 40, and the operation of the signal processing circuit 4 (driver circuit 20 and detection circuit 30) is checked using the adjustment value (adjustment data 42) written into the adjustment register 422. An optimum adjustment value at which the signal processing circuit 4 (driver circuit 20 and detection circuit 30) implements the desired operation is determined while changing the adjustment value, and written into the nonvolatile memory 50 only once as the adjustment data 52. This makes it possible to reduce the inspection time, and minimize a decrease in reliability due to application of a high power supply voltage during a data write operation.

The above adjustment method is implemented by causing the adjustment circuit 60 to selectively use the adjustment data stored in the nonvolatile memory 50 or the adjustment data stored in the adjustment register 422. Therefore, the level determination circuit 70 determines the level of the voltage VPP, and generates the level determination signal 72 that indicates whether the voltage VPP is equal to or higher than a given voltage V1 (e.g., 8 V) that is higher than the voltage VDD, or equal to or lower than a given voltage V2 (e.g., ½ VDD) that is lower than the voltage VDD, or higher than the voltage V2 and lower than the voltage V1. The adjustment circuit 60 selects the adjustment data 42 stored in the internal register when the level determination signal 72 indicates that VPP≥V1 or VPP≤V2, and selects the adjustment data 52 stored in the nonvolatile memory 50 when the level determination signal 72 indicates that V2<VPP<V1.

Since the external input terminal 85 is set to open when the angular velocity detection apparatus 1 is actually used, the voltage VPP becomes almost equal to the voltage VDD via the pull-up resistor 92, and the adjustment circuit 60 necessarily selects the adjustment data 52. On the other hand, it is possible to cause the adjustment circuit 60 to select the adjustment data 42 during assembly, inspection, evaluation, analysis, or the like of the angular velocity detection apparatus 1 by applying a voltage equal to or higher than the voltage V1, or a voltage (e.g., 0 V) equal to or lower than the voltage V2, to the external input terminal 85.

A normal operation mode (mode 1) or an operation mode (mode 2) used during assembly, inspection, evaluation, analysis, or the like of the angular velocity detection apparatus 1 can be selected by rewriting the setting value stored in the mode setting register 424. For example, the mode 1 is selected when the 5-bit setting value stored in the mode setting register 424 is "00000", and the mode 2 is selected when the 5-bit setting value stored in the mode setting register 424 is any of "00001" to "11111". The mode 2 is subdivided corresponding to each of the setting values "00001" to "11111". The monitor target node of the signal processing circuit 4 (driver circuit 20 and detection circuit 30) can be selected, or the connection relationship can be changed corresponding to the setting value.

Only the mode 1 can be selected (the mode 2 cannot be selected) when the angular velocity detection apparatus 1 is actually used in order to ensure reliability, and the mode 1 or the mode 2 can be selected only during assembly, inspection, evaluation, analysis, or the like of the angular velocity detection apparatus 1. Therefore, a rewrite of the setting value stored in the mode setting register 424 is enabled only when VPP≥V1 or VPP≤V2, and is disabled when V2<VPP<V1. Specifically, the level determination signal 72 is supplied to an asynchronous reset terminal of the mode setting register 424. Therefore, the setting value stored in the mode setting register 424 is reset to "00000" (i.e., the mode 1 is selected, and a rewrite of the setting value stored in the mode setting register 424 is disabled) when VPP≥V1 or VPP≤V2, and a rewrite of the setting value stored in the mode setting register 424 is enabled when V2<VPP<V1.

The angular velocity detection apparatus 1 can be evaluated or analyzed even when a power supply device that generates a high voltage is not provided, by causing the adjustment circuit 60 to select the adjustment data 42, and enabling a rewrite of the setting value stored in the mode setting register 424 when VPP≥V1 or VPP≤V2.

Figure 6:
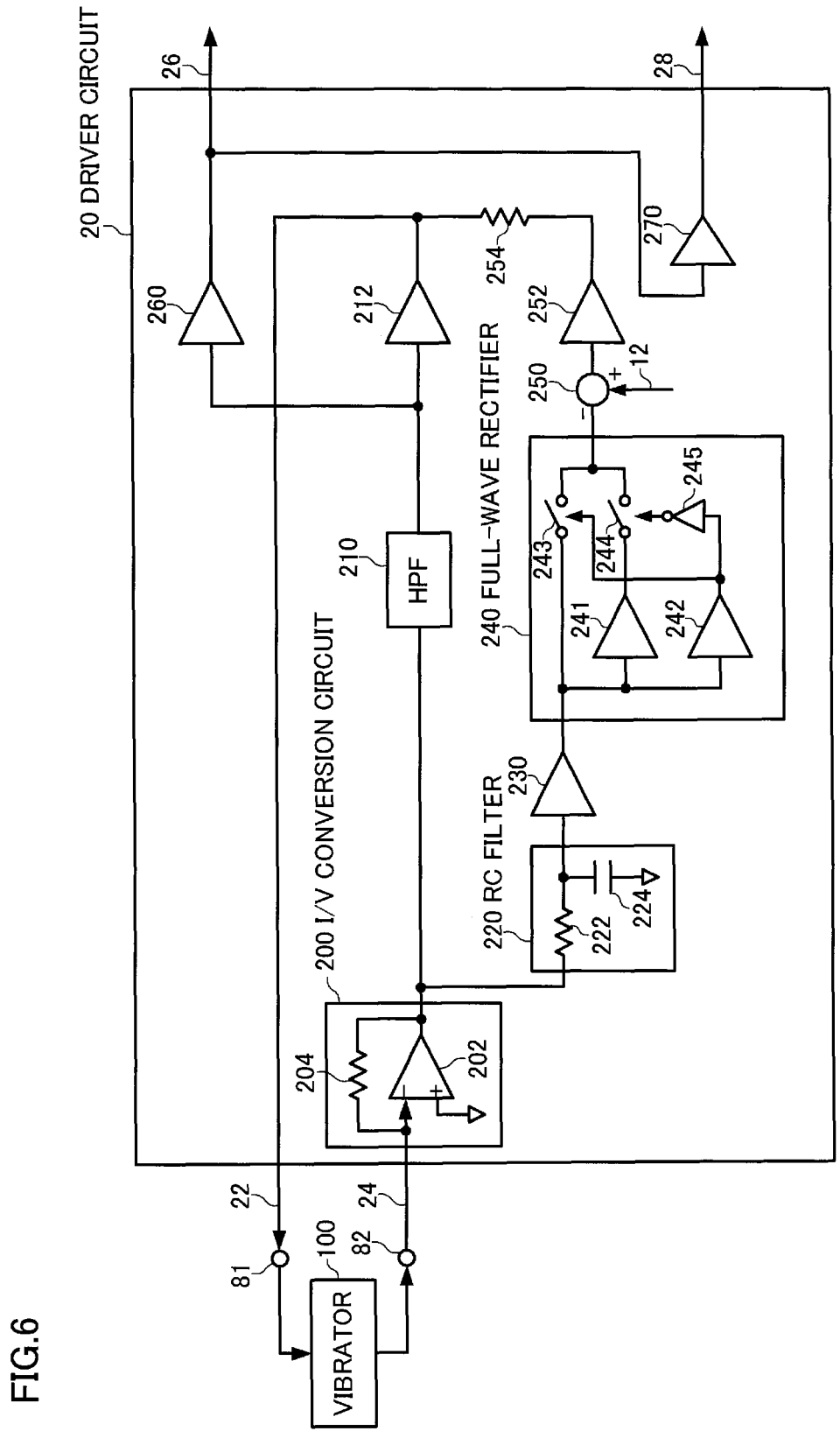
FIG. 6 is a diagram illustrating a configuration example of a driver circuit.

The driver circuit 20 is described below. FIG. 6 is a diagram illustrating a configuration example of the driver circuit 20. As illustrated in FIG. 6, the driver circuit 20 includes an I/V conversion circuit (current/voltage conversion circuit) 200, a high-pass filter (HPF) 210, a comparator 212, an RC filter 220, an amplifier 230, a full-wave rectifier 240, a subtractor 250, an integrator 252, a pull-up resistor 254, a comparator 260, and a buffer circuit 270. Note that the driver circuit 20 may have a configuration in which some of these sections (elements) are omitted, or an additional section (element) is provided.

The I/V conversion circuit 200 converts a drive current that flows through the vibrating element included in the vibrator 100 into an alternating voltage signal. The I/V conversion circuit 200 has a configuration in which a resistor 204 is connected between an inverting input terminal (− input terminal) and an output terminal of an operational amplifier 202, and a non-inverting input terminal (+ input terminal) of the operational amplifier 202 is connected to analog ground. When the oscillation current of the vibrator 100 is referred to as i, and the resistance of the resistor 204 is referred to as R, the output voltage $V_{IV}$ of the I/V conversion circuit 200 is given by the following expression (1).

$$V_{IV} = -R \cdot i \qquad (1)$$

The output signal of the I/V conversion circuit 200 is offset-cancelled by the high-pass filter 210, and input to the comparator 212. The comparator 212 amplifies the voltage of the input signal, and outputs a binary signal (square-wave voltage signal). Note that the comparator 212 is an open-drain output comparator that can output only the low level, and the high level is pulled up to the output voltage of the integrator 252 via the pull-up resistor 254. The binary signal output from the comparator 212 is supplied to the drive electrode 112 of the vibrating element included in the vibrator 100 as the drive signal 22 via the external output terminal 81. It is possible to cause the vibrator 100 to oscillate (vibrate) stably by setting the frequency (drive frequency $f_d$) of the drive signal 22 to be equal to the resonance frequency of the vibrator 100.

The amplitude of the drive signal 22 is adjusted so that the oscillation current of the vibrator 100 is constant (i.e., the level of the output voltage of the I/V conversion circuit 200 is constant). This makes it possible to cause the vibrator 100 to oscillate (vibrate) very stably, so that the angular velocity detection accuracy can be improved.

However, since the resistance R of the resistor 204 included in the I/V conversion circuit 200 varies by about ±20% with respect to the design value due to an IC process variation, the conversion rate of the oscillation current of the vibrator 100 into the output voltage of the I/V conversion circuit 200 varies depending on the IC. Therefore, the oscillation current of the vibrator 100 differs depending on the IC if the amplitude of the drive signal 22 is adjusted so that the level of the output voltage of the I/V conversion circuit 200 is equal to a constant design value. As a result, the angular velocity detection accuracy or the angular velocity detection sensitivity may deteriorate when the oscillation current differs from the design value to a large extent.

Moreover, since the resistance of the resistor 204 does not have flat temperature characteristics, the output voltage of the I/V conversion circuit 200 changes due to the resistor 204 even if the oscillation current of the vibrator 100 is constant. As a result, the oscillation current of the vibrator 100 changes depending on the temperature, so that the angular velocity detection accuracy or the angular velocity detection sensitivity may deteriorate. Likewise, the angular velocity detection accuracy or the angular velocity detection sensitivity may deteriorate due to a process variation or a temperature-dependent variation in the capacitance of capacitors 304 and 314 of charge amplifiers 300 and 310 included in the detection circuit 30.

In order to solve the above problems, the RC filter 220 is provided in order to cancel a process variation or a temperature-dependent variation in the resistance of the resistor 204 and the capacitance of the capacitors 304 and 314, and suppress a deterioration in the angular velocity detection accuracy or the angular velocity detection sensitivity. The output signal of the I/V conversion circuit 200 is passed through the RC filter 220. The reason why a deterioration in the angular velocity detection accuracy or the angular velocity detection sensitivity can be suppressed by providing the RC filter 220 is described later in connection with the detection circuit 30.

The RC filter 220 includes a resistor 222 and a capacitor 224, and functions as a first-order low-pass filter. Specifically, when the resistance of the resistor 222 is referred to as $R_1$, and the capacitance of the capacitor 224 is referred to as $C_1$, the transfer function of the RC filter 220 is given by the following expression (2).

$$H(s) = \frac{1}{1 + s \cdot C_1 \cdot R_1} \quad (2)$$

The frequency characteristics of the voltage gain of the RC filter 220 are given by the following expression (3) based on the expression (2).

$$|H(j\omega)| = \frac{1}{\sqrt{1 + (\omega \cdot C_1 \cdot R_1)^2}} \quad (3)$$

The resistance $R_1$ and the capacitance $C_1$ are selected so that "$(\omega_d \cdot C_1 \cdot R_1)2 \gg 1$" is satisfied (where, $\omega_d$ ($=2\pi f_d$) is the oscillation angular frequency of the vibrator 100). In this case, the output voltage $V_{RC}$ of the RC filter 220 is given by the following expression (4) based on the expressions (1) and (3).

$$V_{RC} \approx -\frac{R \cdot i}{\omega_d \cdot C_1 \cdot R_1} \quad (4)$$

The frequency characteristics of the phase of the RC filter 220 are given by the following expression (5) based on the expression (2).

$$\angle H(j\omega) = \arctan(\omega \cdot C_1 \cdot R_1) \quad (5)$$

Therefore, the output signal (angular frequency: $\omega_d$) of the I/V conversion circuit 200 is delayed in phase by $\theta = \arctan(\omega_d \cdot C_1 \cdot R_1)$ when the output signal is passed through the RC filter 220. Specifically, the RC filter 220 also functions as a phase shift circuit. For example, $\theta$ is almost equal to 84° when $\omega_d = 2\pi \times 50$ kHz ($f_d = 50$ kHz) and $C_1 \cdot R_1 = 1/(2\pi \times 5$ kHz).

Note that the amplitude of the output signal (angular frequency: $\omega_d$) of the I/V conversion circuit 200 is attenuated by a factor of about $1/(\omega_d \cdot C_1 \cdot R_1)$ when the output signal is passed through the RC filter 220 (see the expression (4)). For example, when $\omega_d = 2\pi \times 50$ kHz ($f_d = 50$ kHz) and $C_1 \cdot R_1 = 1/(2\pi \times 5$ kHz), the amplitude of the output signal of the RC filter 220 is about 1/10th of the amplitude of the output signal of the I/V conversion circuit 200. The voltage correction amplifier 230 that amplifies the output signal of the RC filter 220 (e.g., an amplifier that amplifies the input signal by a factor of $\omega_d \cdot C_1 \cdot R_1$) is provided in order to facilitate signal processing performed by the circuit in the subsequent stage of the RC filter 220. Note that the amplifier 230 may be omitted when the circuit in the subsequent stage of the RC filter 220 can perform signal processing directly on the output signal of the RC filter 220.

The output signal of the amplifier 230 is input to the full-wave rectifier 240. The full-wave rectifier 240 includes an inversion amplifier 241, a comparator 242, a switch 243, a switch 244, and an inverter circuit 245 (inversion logic circuit). The output signal of the amplifier 230 is input to the switch 243. The switch 243 is ON/OFF-controlled using the output signal of the comparator 242. The frequency of the output signal of the comparator 242 is equal to the drive frequency $f_d$. The output signal of the inversion amplifier 241 (i.e., an inverted signal of the output signal of the amplifier 230) is input to the switch 244. The switch 244 is ON/OFF-controlled using the output signal of the inverter circuit 245 (i.e., an inverted signal of the output signal of the comparator 242). Specifically, the switch 243 and the switch 244 are ON/OFF-controlled exclusively, and the output signal of the amplifier 230 is full-wave rectified.

The output signal of the full-wave rectifier 240 is input to the subtractor 250, subtracted from the reference voltage 12, and integrated by the integrator 252. The output voltage of the integrator 252 decreases as the amplitude of the output signal of the I/V conversion circuit 200 increases. Since the high level of the drive signal 22 is pulled up to the output voltage of the integrator 252 via the pull-up resistor 254, the amplitude $V_{DR}$ of the drive signal 22 is in inverse proportion to the output voltage $V_{RC}$ of the RC filter 220, and is given by the following expression (6) based on the expression (4) using an appropriate coefficient A.

$$V_{DR} \approx -A \cdot \frac{\omega_d \cdot C_1 \cdot R_1}{R \cdot i} \quad (6)$$

The amplitude of the drive signal 22 is thus feedback-controlled so that the amplitude of the oscillation current 24 of the vibrator 100 is maintained constant.

The driver circuit 20 includes the comparator 260 that amplifies the output signal of the high-pass filter 210, and outputs a binary signal (square-wave voltage signal). The binary signal is used as the reference signal 26 input to the synchronous detection circuit included in the detection circuit 30. The frequency of the reference signal 26 is equal to the drive frequency $f_d$. Since the high level of the output signal of the comparator 212 changes, a problem occurs when the high level does not exceed the logical threshold value of the synchronous detection circuit. Therefore, the output signal of the comparator 212 is not used as the reference signal, and the comparator 260 is separately provided.

The output signal of the comparator 260 is input to the buffer circuit 270, and the output signal of the buffer circuit 270 is supplied to the SCF circuit included in the detection circuit as the clock signal 28 (frequency: $f_d$).

Figure 7:
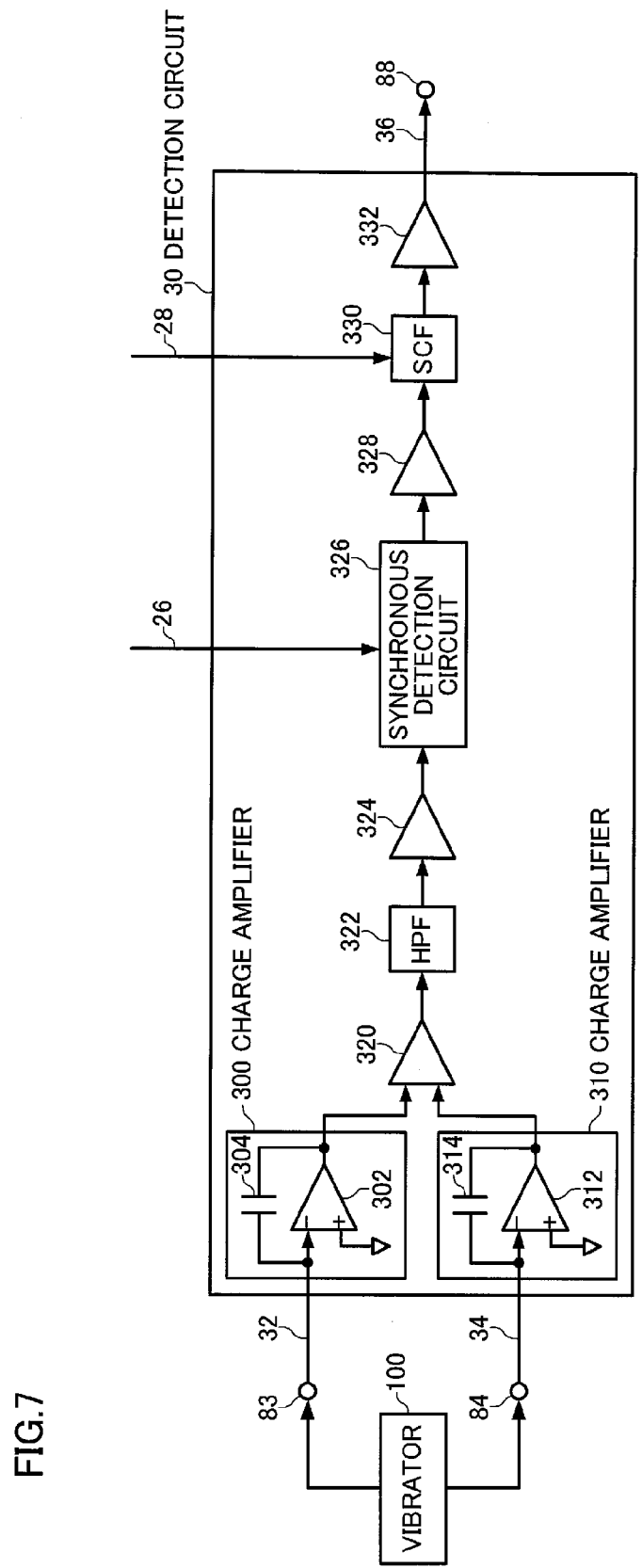
FIG. 7 is a diagram illustrating a configuration example of a detection circuit.

The detection circuit 30 is described below. FIG. 7 is a diagram illustrating a configuration example of the detection circuit 30. As illustrated in FIG. 7, the detection circuit 30 includes the charge amplifier 300, the charge amplifier 310, a differential amplifier 320, a high-pass filter (HPF) 322, an amplifier 324, a synchronous detection circuit 326, a programmable gain amplifier 328, a switched capacitor filter (SCF) 330, and an output buffer 332. Note that the detection circuit 30 may have a configuration in which some of these sections (elements) are omitted, or an additional section (element) is provided.

The alternating charge (detection current) 32 that includes the angular velocity component and the leakage vibration component is input to the charge amplifier 300 from the detection electrode 114 of the vibrating element included in the vibrator 100 via the external input terminal 83. The alternating charge (detection current) 34 that includes the angular velocity component and the leakage vibration component is input to the charge amplifier 310 from the detection electrode 115 of the vibrating element included in the vibrator 100 via the external input terminal 84.

The charge amplifier 300 has a configuration in which a capacitor 304 is connected between an inverting input terminal (− input terminal) and an output terminal of an operational amplifier 302, and a non-inverting input terminal (+ input terminal) of the operational amplifier 302 is connected to analog ground. The charge amplifier 310 has a configuration in which a capacitor 314 is connected between an inverting input terminal (− input terminal) and an output terminal of an operational amplifier 312, and a non-inverting input terminal (+ input terminal) of the operational amplifier 312 is connected to analog ground. The capacitance of the capacitor 304 and the capacitance of the capacitor 314 are set to an identical value. The charge amplifier 300 converts the alternating charges (detection current) 32 input thereto into an alternating voltage signal, and the charge amplifier 310 converts the alternating charges (detection current) 34 input thereto into an alternating voltage signal. The alternating charge (detection current) 32 input to the charge amplifier 300 and the alternating charge (detection current) 34 input to the charge amplifier 310 differ in phase by 180°, and the phase of the output signal of the charge amplifier 300 and the phase of the output signal of the charge amplifier 310 are opposite to each other (i.e., shifted by 180°).

When the detection current 32 is referred to as $i_1$, the angular frequency of the detection current 32 is referred to as $\omega_1$, and the capacitance of the capacitor 304 is referred to as C, the output voltage $V_{CA1}$ of the charge amplifier 300 is given by the following expression (7).

$$V_{CA1} = \frac{i_1}{\omega_1 \cdot C} \quad (7)$$

When the detection current 34 is referred to as $-i_1$, the angular frequency of the detection current 34 is referred to as $\omega_1$, and the capacitance of the capacitor 314 is referred to as C, the output voltage $V_{CA2}$ of the charge amplifier 310 is given by the following expression (8).

$$V_{CA2} = \frac{i_1}{\omega_1 \cdot C} \quad (8)$$

Since the detection current $i_1$ is in proportion to the amplitude $V_{DR}$ of the drive signal 22, the output voltage $V_{CA1}$ and the output voltage $V_{CA2}$ are respectively given by following expressions (9) and (10) based on the expressions (6), (7), and (8) using an appropriate coefficient B.

$$V_{CA1} \approx B \cdot \frac{\omega_d \cdot C_1 \cdot R_1}{\omega_1 \cdot C \cdot R \cdot i} \quad (9)$$

$$V_{CA2} \approx -B \cdot \frac{\omega_d \cdot C_1 \cdot R_1}{\omega_1 \cdot C \cdot R \cdot i} \quad (10)$$

The differential amplifier 320 differentially amplifies the output signal of the charge amplifier 300 and the output signal of the charge amplifier 310. The differential amplifier 320 cancels the in-phase component, and amplifies the out-of-phase component. When the gain of the differential amplifier 320 is 1, the output voltage $V_{DF}$ of the differential amplifier 320 is given by the following expression (11) based on the expressions (9) and (10).

$$V_{DF} \approx 2B \cdot \frac{\omega_d \cdot C_1 \cdot R_1}{\omega_1 \cdot C \cdot R \cdot i} \quad (11)$$

Therefore, a process variation and a temperature-dependent variation in the resistance R of the resistor 204 of the I/V conversion circuit 200 are canceled by a process variation and a temperature-dependent variation in the resistance $R_1$ of the resistor 222 of the RC filter 220 (see the expression (11)). Likewise, a process variation and a temperature-dependent variation in the capacitance C of the capacitor 304 of the charge amplifier 300 and the capacitance C of the capacitor 314 of the charge amplifier 310 are canceled by a process variation and a temperature-dependent variation in the capacitance $C_1$ of the capacitor 224 of the RC filter 220. This makes it possible to suppress a deterioration in the angular velocity detection accuracy or the angular velocity detection sensitivity.

The high-pass filter 322 cancels the direct-current component included in the output signal of the differential amplifier 320.

The amplifier 324 outputs an alternating voltage signal obtained by amplifying the output signal of the high-pass filter 322.

The synchronous detection circuit 326 synchronously detects the angular velocity component included in the output signal of the amplifier 324 using the binary signal output from the comparator 260 included in the driver circuit 20 as the reference signal 26. The synchronous detection circuit 326 may be configured to select the output signal of the amplifier 324 when the reference signal 26 is set at the high level, and select a signal obtained by inverting the output signal of the amplifier 324 with respect to the reference voltage 12 when the reference signal 26 is set at the low level.

The output signal of the amplifier 324 includes the angular velocity component and the leakage vibration component. The angular velocity component has the same phase as that of the reference signal 26, and the leakage vibration component has a phase opposite to that of the reference signal 26. Therefore, the synchronous detection circuit 326 synchronously detects the angular velocity component, but does not synchronously detect the leakage vibration component.

The programmable gain amplifier 328 amplifies or attenuates the output signal of the synchronous detection circuit 326, and outputs a signal at the desired voltage level. The output signal of the programmable gain amplifier 328 is input to the switched capacitor filter (SCF) circuit 330.

The SCF circuit 330 functions as a low-pass filter that removes a high-frequency component included in the output signal of the programmable gain amplifier 328, and allows a signal within a frequency range that is determined in accordance with the specification.

Figure 8:
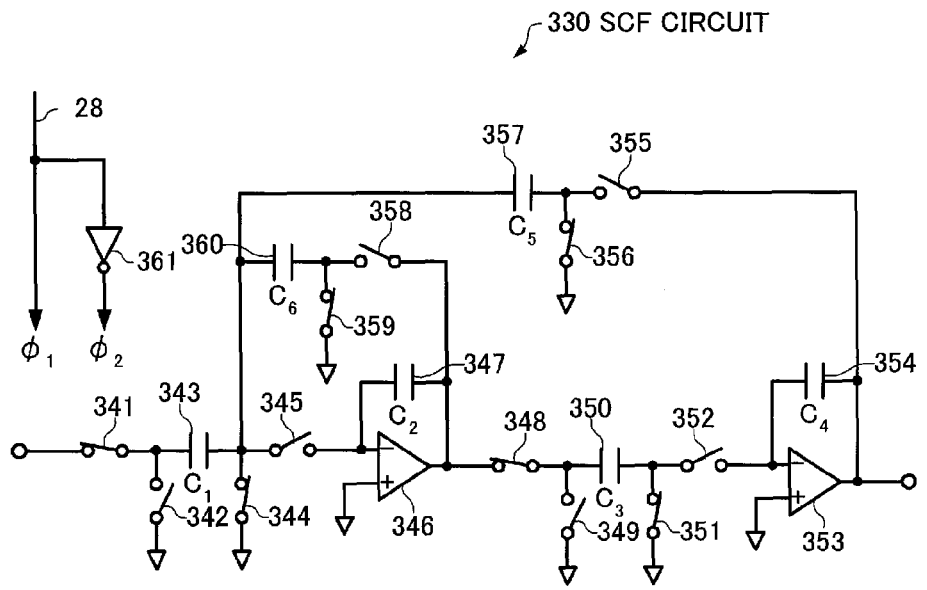
FIG. 8 is a diagram illustrating a configuration example of an SCF circuit.

FIG. 8 is a diagram illustrating a configuration example of the SCF circuit 330. The SCF circuit 330 includes twelve switches 341, 342, 344, 345, 348, 349, 351, and 352, six capacitors 343, 347, 350, 354, 357, and 360, two operational amplifiers 346 and 353, and one inverter circuit (inversion logic circuit) 361.

The first terminal of the switch 341 is connected to the input terminal of the SCF circuit 330. The output signal of the programmable gain amplifier 328 is supplied to the first terminal of the switch 341. The second terminal of the switch 341, the first terminal of the switch 342, and the first terminal of the capacitor 343 are connected. The second terminal of the switch 342 is connected to analog ground.

The second terminal of the capacitor 343, the first terminal of the switch 344, the second terminal of the switch 345, the first terminal of the capacitor 357, and the first terminal of the capacitor 360 are connected. The second terminal of the switch 344 is connected to analog ground.

A first terminal of the switch 345, the inverting input terminal (− input terminal) of the operational amplifier 346, and the first terminal of the capacitor 347 are connected. The non-inverting input terminal (+ input terminal) of the operational amplifier 346 is connected to analog ground.

The second terminal of the capacitor 357, the first terminal of the switch 355, and the first terminal of the switch 356 are connected. The second terminal of the switch 356 is connected to analog ground.

The second terminal of the capacitor 360, the first terminal of the switch 358, and the first terminal of the switch 359 are connected. The second terminal of the switch 359 is connected to analog ground.

The output terminal of the operational amplifier 346, the second terminal of the capacitor 347, the second terminal of the switch 358, and the first terminal of the switch 348 are connected. The second terminal of the switch 348, the first terminal of the switch 349, and the first terminal of the capacitor 350 are connected. The second terminal of the switch 349 is connected to analog ground.

The second terminal of the capacitor 350, the first terminal of the switch 351, and the second terminal of the switch 352 are connected. The second terminal of the switch 351 is connected to analog ground.

The first terminal of the switch 352, the inverting input terminal (− input terminal) of the operational amplifier 353, and the first terminal of the capacitor 354 are connected. The non-inverting input terminal (+ input terminal) of the operational amplifier 353 is connected to analog ground.

The output terminal of the operational amplifier 353, the second terminal of the capacitor 354, and the second terminal of the switch 355 are connected to the output terminal of the SCF circuit 330.

The clock signal 28 (frequency: $f_d$) output from the buffer circuit 270 is input to the inverter circuit 361, and is inverted in logic level. The clock signal 28 and the output signal of the inverter circuit 361 functions as two-phase clock signals $\phi_1$ and $\phi_2$ for the SCF circuit 330. The clock signal $\phi_1$ ON/OFF-controls the switches 341, 344, 348, 351, 356, and 359, and the clock signal $\phi_2$ ON/OFF-controls the switches 342, 345, 349, 352, 355, and 358.

The input section of the SCF circuit 330 is formed by the switch 341, the switch 342, and the capacitor 343, and the frequency characteristics are determined by the feedback circuit formed by the remaining elements.

When the cycle of the clock signals $\phi_1$ and $\phi_2$ is referred to as T ($=1/f_d$), the capacitance of the capacitor 343 is referred to as $C_1$, the capacitance of the capacitor 347 is referred to as $C_2$, the capacitance of the capacitor 350 is referred to as $C_3$, the capacitance of the capacitor 354 is referred to as $C_4$, the capacitance of the capacitor 357 is referred to as $C_5$, and the capacitance of the capacitor 360 is referred to as $C_6$, a continuous-time transfer function equivalent to the transfer function (discrete-time transfer function) of the SCF circuit 330 is given by the following expression (12).

$$H(s) = \frac{C_1}{C_5} \cdot \frac{\frac{1}{T^2} \cdot \frac{C_3 \cdot C_5}{C_2 \cdot C_4}}{s^2 + \frac{1}{T} \cdot \frac{C_6}{C_2} \cdot s + \frac{1}{T^2} \cdot \frac{C_3 \cdot C_5}{C_2 \cdot C_4}} \tag{12}$$

Specifically, the SCF circuit 330 functions as a second-order low-pass filter. The gain K, the cutoff angular frequency $\omega_c$, and the quality factor Q are given by the following expressions (13), (14), and (15), respectively.

$$K = \frac{C_1}{C_5} \tag{13}$$

$$\omega_c = \frac{1}{T} \cdot \sqrt{\frac{C_3 \cdot C_5}{C_2 \cdot C_4}} \tag{14}$$

$$Q = \frac{1}{C_6} \cdot \sqrt{\frac{C_3 \cdot C_5 \cdot C_2}{C_4}} \tag{15}$$

Specifically, the gain of the SCF circuit 330 is determined by the ratio of the capacitance of the capacitor 343 to the capacitance of the capacitor 357 (see the expression (13)). The cutoff frequency $f_c$ ($=\omega_c/2\pi$) of the SCF circuit 330 is determined by the frequency $f_d$ ($=1/T$) of the clock signal 28, and the ratio of the product of the capacitance of the capacitor 350 and the capacitance of the capacitor 357 to the product of the capacitance of the capacitor 347 and the capacitance of the capacitor 354 (see the expression (14)). The quality factor of the SCF circuit 330 is determined by the ratio of the product of the capacitance of the capacitor 347, the capacitance of the capacitor 350, and the capacitance of the capacitor 357 to the product of the capacitance of the capacitor 354 and the second power of the capacitance of the capacitor 360 (see the expression (15)). Specifically, since the gain and the frequency characteristics of the SCF circuit 330 (low-pass filter) are determined by the frequency of the clock signal 28 obtained by stable oscillation (vibration) of the vibrator 100 and the capacitance ratio of the capacitors, a variation in frequency characteristics of the SCF circuit 330 is very small as compared with an RC low-pass filter.

When the capacitances $C_1$ to $C_6$ are selected so that $C_1 = C_G$, $C_3 = C_5 = C_r$, $C_2 = C_4 = C_f$, and $C_6 = C_Q$, the expressions (13), (14), and (15) can be simplified as follows (expressions (16), (17), and (18)).

$$K = \frac{C_G}{C_r} \tag{16}$$

$$\omega_c = \frac{1}{T} \cdot \frac{C_r}{C_f} \tag{17}$$

$$Q = \frac{C_r}{Q_Q} \tag{18}$$

The output signal of the SCF circuit 330 is buffered by the output buffer 332, and optionally amplified or attenuated to a signal at the desired voltage level. The output signal of the output buffer 326 is a signal at a voltage level corresponding to the angular velocity, and is output to the outside as the angular velocity signal 36 via the external output terminal 88 of the signal processing IC 2.

When the noise voltage at the input of the SCF circuit 330 is referred to as $V_{N1}$, the noise voltage generated in the SCF circuit 330 is referred to as $V_{N2}$, the gain of the SCF circuit 330 is referred to as $K_1$, and the gain of the output buffer 332 is referred to as $K_2$, the noise voltage $V_N$ included in the output signal (angular velocity signal 36) of the output buffer 332 is approximately calculated by the following expression (19).

$$V_N = \sqrt{(K_1 \cdot K_2 \cdot V_{N1})^2 + (K_2 \cdot V_{N2})^2} \tag{19}$$

The signal level of the output signal (angular velocity signal 36) of the detection circuit 30 is determined by the detection sensitivity determined in accordance with the specification. Specifically, the total gain of the detection circuit 30 is determined by the detection sensitivity. According to related-art design, the gain $K_1$ of the SCF circuit 330 that functions as a low-pass filter is fixed at 1, and the gain $K_2$ of the output buffer 332 in the final stage is adjusted so that the detection circuit 30 has the desired total gain. In this case ($K_1 = 1$), the expression (19) is transformed as follows (see expression (20)).

$$V_N = \sqrt{(K_2 \cdot V_{N1})^2 + (K_2 \cdot V_{N2})^2} \tag{20}$$

When the noise voltage $VN_1$ and the noise voltage $VN_2$ are almost constant, the noise voltage $V_N$ included in the angular velocity signal 36 increases as the gain $K_2$ of the output buffer 332 increases. When the detection circuit 30 is designed to have a high total gain, however, it may be impossible to provide the input range of the SCF circuit 330 (i.e., signal clipping may occur) depending on the design when increasing the gain of the circuit in the preceding stage of the SCF circuit 330, so that it may be necessary to increase the gain $K_2$ of the output buffer 332 in the final stage. This makes it difficult to further reduce noise.

In order to adjust the total gain of the detection circuit 30 to the desired value without increasing the gain of the circuit in the preceding stage of the SCF circuit 330, it is necessary to provide a constant gain G using the SCF circuit 330 and the output buffer 332. When $K_1 \cdot K_2 = G$, the expression (20) is transformed as follows (see expression (21)).

$$V_N = \sqrt{(G \cdot V_{N1})^2 + \left(\frac{G}{K_1} \cdot V_{N2}\right)^2} \tag{21}$$

Since the term "$(G \cdot V_{N1})_2$" is a constant value, it is necessary to decrease the value indicated by the term "$(G/K_1 \cdot VN_2)_2$" in order to decrease the noise voltage $V_N$. Specifically, when G is set to a constant value, it is necessary to increase the gain $K_1$ or decrease the noise voltage $VN_2$ in order to decrease the noise voltage $V_N$.

Noise may occur in the SCF circuit 330 due to each switch, each capacitor, or each operational amplifier, for example. It is difficult to substantially reduce such noise without substantially increasing the circuit area. Specifically, the noise voltage $VN_2$ can be decreased to only a limited extent.

Therefore, the noise voltage VN included in the angular velocity signal 36 is decreased by utilizing the feature that the SCF circuit 330 is an active filter (i.e., the gain $K_1$ can be increased to a value larger than 1). Since the gain of the SCF circuit 330 is given by the expression (13), the gain $K_1$ can be increased to a value larger than 1 by setting the capacitance $C_1$ of the capacitor 343 to be larger than the capacitance $C_5$ of the capacitor 357. According to related-art design, the capacitance $C_1$ is set to be equal to the capacitance $C_5$. Since the amount of charge stored in the capacitor 343 when the switch 341 has been turned ON increases as a result of increasing the capacitance $C_1$, the level of the signal input to the feedback circuit in the subsequent stage increases, so that the gain $K_1$ increases. Since only an increase in the level of the signal input to the feedback circuit occurs when increasing the gain $K_1$, noise that may occur due to each switch, each capacitor, and each amplifier included in the feedback circuit is not amplified. Therefore, the noise voltage $V_{N2}$ changes to only a small extent when increasing the gain $K_1$.

Accordingly, the noise voltage $V_N$ can be decreased by increasing the gain $K_1$ ($K_1 > 1$) (see the expression (21), so that noise can be further reduced.

Figure 9:
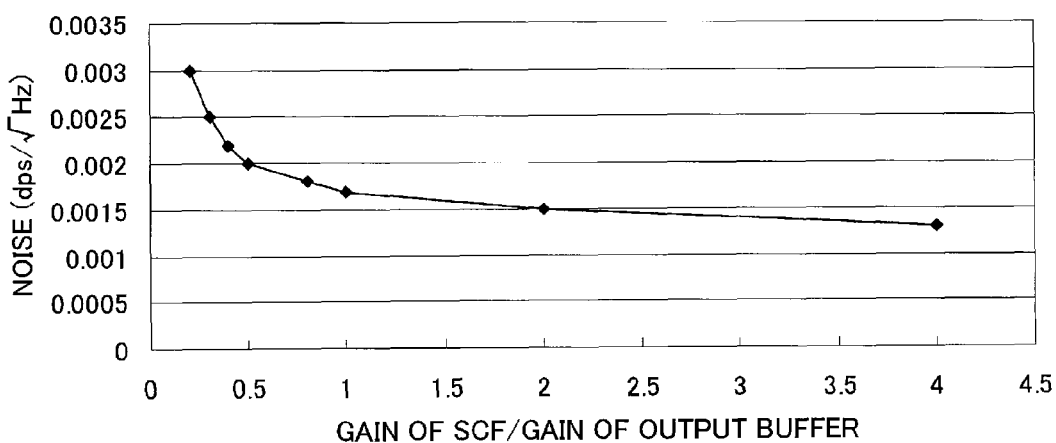
FIG. 9 is a diagram illustrating the relationship between the ratio of the gain of an SCF circuit to the gain of an output buffer and the level of noise.

FIG. 9 is a diagram illustrating a correlation between the ratio ($K_1/K_2$) of the gain $K_1$ of the SCF circuit 330 to the gain $K_2$ of the output buffer 332 and the level of noise included in the angular velocity signal 36. In FIG. 9, the horizontal axis indicates the ratio "$K_1/K_2$", and the vertical axis indicates the level of noise (dps/√Hz). As illustrated in FIG. 9, noise can be reduced when $K_1/K_2 > 0.5$, and can be further reduced when $K_1/K_2 > 1$. It is more preferable to set the gain $K_1$ of the SCF circuit 330 to a value larger than 1 ($K_1 > 1$). Although the level of noise is plotted within the $K_1/K_2$ range of 0.2 to 4 in FIG. 9, the inventor confirmed that noise can also be reduced when increasing the ratio "$K_1/K_2$" up to 20.

According to the detection circuit 30, the gain of the output buffer 332 can be relatively decreased by causing the SCF circuit 330 that functions as a low-pass filter to also function as an amplifier circuit by setting the gain of the SCF circuit 330 to a value larger than 1. This makes it possible to decrease the amplification factor of the output buffer 332 on noise that occurs in the switched capacitor filter 330, so that noise can be reduced.

Note that the detection circuit 30 corresponds to the detection circuit according to the invention. The synchronous detection circuit 326 corresponds to the synchronous detection section according to the invention. The switched capacitor filter 330 corresponds to the switched capacitor filter according to the invention. The output buffer 332 corresponds to the output buffer according to the invention.

2. Electronic Instrument

Figure 10:
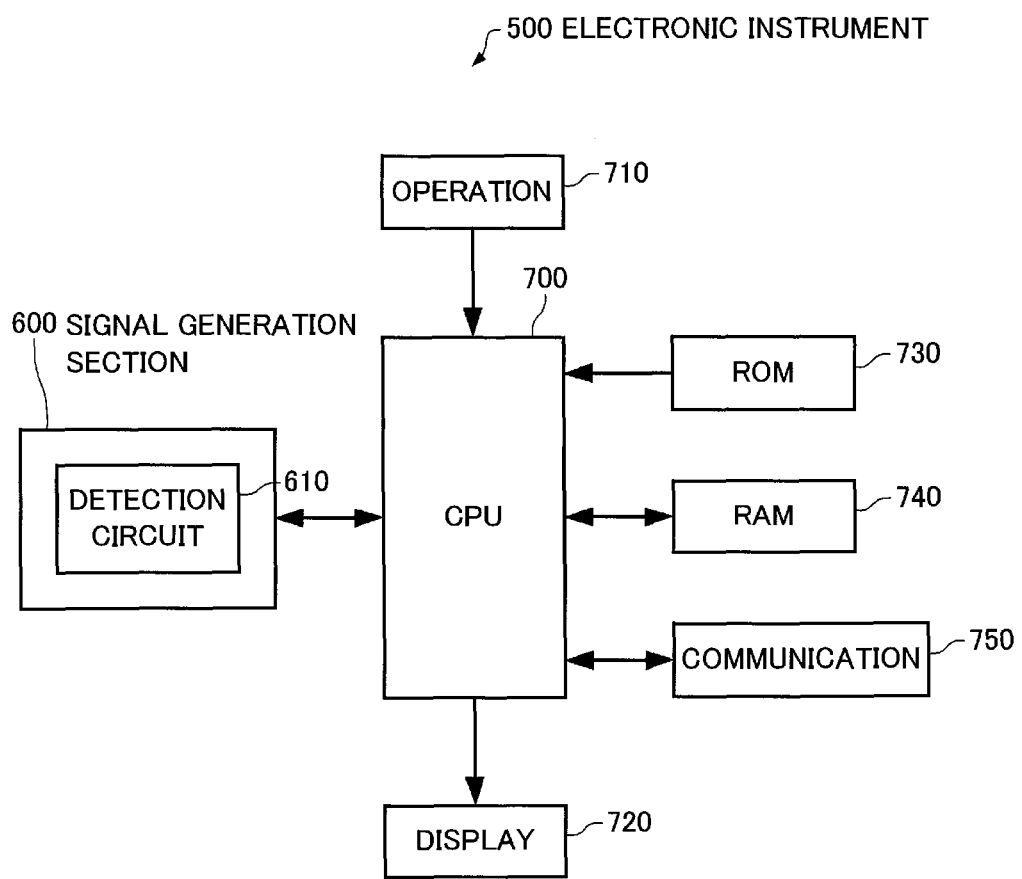
FIG. 10 is a functional block diagram of an electronic instrument.

FIG. 10 is a functional block diagram illustrating a configuration example of an electronic instrument according to one embodiment of the invention. An electronic instrument 500 according to one embodiment of the invention includes a signal generation section 600, a CPU 700, an operation section 710, a display section 720, a read-only memory (ROM) 730, a random access memory (RAM) 740, and a communication section 750. Note that the electronic instrument 500 may have a configuration in which some of the elements (sections) illustrated in FIG. 10 are omitted, or an additional element (section) is provided.

The signal generation section 600 includes a detection circuit 610. The signal generation section 600 generates a given signal under control of the CPU 700, and outputs the generated signal to the CPU 700. The detection circuit 610 generates a signal that corresponds to the magnitude of a given physical quantity based on the output signal of a vibrator (not illustrated in FIG. 10) that oscillates (vibrates).

The CPU 700 performs a calculation process and a control process according to a program stored in the ROM 730. More specifically, the CPU 700 controls the signal generation section 600, receives the signal generated by the signal generation section 600, and performs a calculation process. The CPU 700 also performs a process based on an operation signal from the operation section 710, a process that transmits a display signal for displaying information on the display section 720, a process that controls the communication section 750 for performing data communication with the outside, and the like.

The operation section 120 is an input device that includes an operation key, a button switch, and the like. The operation section 120 outputs the operation signal based on an operation performed by the user to the CPU 700.

The display section 130 is a display device (e.g., liquid crystal display (LCD)), and displays information based on the display signal input from the CPU 700.

The ROM 730 stores a program that causes the CPU 700 to perform a calculation process or a control process, a program and data for implementing a given function, and the like.

The RAM 740 is used as a work area for the CPU 700. The RAM 740 temporarily stores a program and data read from the ROM 730, data input from the operation section 710, the results of calculations performed by the CPU 700 according to a program, and the like.

The communication section 750 performs a control process for implementing data communication between the CPU 700 and an external device.

It is possible to implement a more accurate process by incorporating the above detection circuit (detection circuit 30 illustrated in FIG. 1) in the electronic instrument 500 as the detection circuit 610.

Examples of the electronic instrument 500 include a digital still camera, a video camera, a navigation system, an automotive posture detection device, a pointing device, a game controller, a mobile phone, a head-mounted display (HMD), and the like.

Note that the invention is not limited to the above embodiments. Various modifications and variations may be made without departing from the scope of the invention.

For example, the excitation means that causes the vibrator (sensor element) to vibrate or the vibration detection means may be an electrostatic means that utilizes an electrostatic force (Coulomb force), a Lorentz-type means that utilizes magnetism, or the like instead of a means that utilizes a piezoelectric effect.

When the high level of the drive signal 22 does not to exceed the logical threshold value of the synchronous detection circuit 326, a signal obtained by buffering the drive signal 22 may be used as the clock signal 28 for the SCF circuit 330.

The invention includes various other configurations substantially the same as the configurations described in connection with the above embodiments (e.g., a configuration having the same function, method, and results, or a configuration having the same objective and effects). The invention also includes a configuration in which an unsubstantial section (part) described in connection with the above embodiments is replaced by another section (part). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A detection circuit comprising:
   a synchronous detection section that synchronously detects an alternating-current signal that corresponds to a detection target physical quantity;
   a switched capacitor filter that filters a signal that has been synchronously detected by the synchronous detection section; and
   an output buffer that buffers and outputs a signal that has been filtered by the switched capacitor filter,
   a gain $K_1$ of the switched capacitor filter being larger than 1, and
   the gain $K_1$ of the switched capacitor filter being larger than a gain $K_2$ of the output buffer.

2. A physical quantity detection apparatus comprising:
   the detection circuit as defined in claim 1; and
   a vibrator that outputs a signal that corresponds to a detection target physical quantity to the detection circuit.

3. An angular velocity detection apparatus comprising the detection circuit as defined in claim 1.

4. An integrated circuit device comprising the detection circuit as defined in claim 1.

5. An electronic instrument comprising the detection circuit as defined in claim 1.

* * * * *